United States Patent
Oeda et al.

(10) Patent No.: US 6,546,032 B1
(45) Date of Patent: Apr. 8, 2003

(54) SEMICONDUCTOR LASER APPARATUS

(75) Inventors: Yasuo Oeda, Sodegaura (JP); Satoru Okada, Sodegaura (JP); Kouichi Igarashi, Sodegaura (JP); Yumi Naito, Ithaca, NY (US); Kiyofumi Muro, Sodegaura (JP); Takeshi Koiso, Sodegaura (JP); Yoshikazu Yamada, Sodegaura (JP); Atsushi Okubo, Sogegaura (JP); Tsuyoshi Fujimoto, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 234 days.

(21) Appl. No.: 09/644,080

(22) Filed: Aug. 23, 2000

(30) Foreign Application Priority Data

Aug. 27, 1999 (JP) .......................... 11-241872

(51) Int. Cl.$^7$ .............................. H01S 5/00; H01L 33/00
(52) U.S. Cl. .............................. 372/45; 372/46; 372/50; 257/94
(58) Field of Search .......................... 372/45, 46, 50; 257/94

(56) References Cited

U.S. PATENT DOCUMENTS

| 5,289,494 A | * | 2/1994 | Tada et al. ..................... 372/96 |
| 5,764,668 A | * | 6/1998 | Ishizaka et al. ................ 372/45 |
| 5,818,860 A | | 10/1998 | Garbuzov et al. |
| 6,031,858 A | * | 2/2000 | Hatakoshi et al. ............. 372/46 |
| 6,175,582 B1 | * | 1/2001 | Naito et al. ................... 372/45 |

FOREIGN PATENT DOCUMENTS

| EP | 578 836 A1 | 1/1994 |
| EP | 0 660 472 | 6/1995 |
| EP | 0 920 097 | 6/1999 |
| JP | 10-303500 | 11/1998 |
| WO | 93/16513 | 8/1993 |

OTHER PUBLICATIONS

Glew, et al., GaAs/(GaAl)As LOC Lasers Grown by MOCVD, 1986, 613–620.
Lelong, et al. A Pulsed High–Power Quantum Well Laser Using an Asymmetric Waveguide, Apr. 1, 1996, pp. 568–570.
Sadao Adachi, Physical Properties of III–V Semiconductor Compounds, 1992, pp. 100–105.

* cited by examiner

Primary Examiner—Eddie Lee
Assistant Examiner—Joseph Nguyen
(74) Attorney, Agent, or Firm—Burns, Doane, Swecker & Mathis LLP

(57) ABSTRACT

On a substrate of n-type GaAs are sequentially formed an n-type cladding layer (AlGaAs, Al content x=0.07, thickness t=2.86 μm), an n-type optical waveguide layer (GaAs, t=0.49 μm), an n-type carrier blocking layer (AlGaAs, x=0.40, t=0.03 μm), an active layer (composed of an $In_{0.18}Ga_{0.82}As$ quantum well layer and a GaAs barrier layer), a p-type carrier blocking layer (AlGaAs, x=0.40, t=0.03 μm), a p-type optical waveguide layer (GaAs, t=0.49 μm), a p-type cladding layer (AlGaAs, x=0.20, t=1.08 μm), and a p-type cap layer (GaAs) in which a pair of n-type current blocking layers (GaAs) are buried. With this construction, the occurrence of a wavelength spit due to a higher-order mode can be inhibited thereby stabilizing a higher power operation.

11 Claims, 7 Drawing Sheets

SEMICONDUCTOR LASER APPARATUS

BACKGROUND OF THE INVENTION

1. Field of the Invention

The present invention relates to a semiconductor laser apparatus for use as a light source for pumping a solid-state laser, a fiber laser, a fiber amplifier or the like, or for use in various laser instrumentation.

2. Description of the Related Art

In realizing a higher power semiconductor laser, it is important to inhibit catastrophic optical mirror damage at the light-emitting end face of the laser. For the purpose of a higher power semiconductor laser, the present applicant has proposed a semiconductor laser provided with a carrier blocking layer having a bandgap larger than an active layer and a small thickness on each of the opposite sides of the active layer, thereby offering widened design freedom as to the thickness of a waveguide layer and the bandgap of a cladding layer which are formed outside each carrier blocking layer (refer to International Publication No. WO93/16513).

In such a structure, carriers injected into the active layer can efficiently be confined by the carrier blocking layers, while laser light generated at the active layer passes through each thin carrier blocking layer and is propagated along an optical waveguide defined mainly by the waveguide layers and cladding layers. By designing the optical waveguide so as to confine light existing in the waveguide layers to a greater extent, the intensity of light in the active layer lowers and, hence, an optical output power at which the catastrophic optical mirror damage (COMD) occurs on the light-emitting facet can be raised, thus leading to a higher power operation.

Japanese Unexamined Patent Publication JP-A 10-303500 (1998) describes a structure such as to enhance confinement of light in the waveguide layers in order to lower the intensity of light existing in the active layer formed in the separate-confinement structure thereby raising an optical output power at which the COMD occurs on the light-emitting facet.

In the case of such enhanced confinement of light in the waveguide layers as in JP-A 10-303500, guided modes which can be propagated along the optical waveguide include not only a fundamental mode but also higher-order modes.

From the standpoint of the lasing conditions, the intensity of light in the active layer creating a gain reaches the highest value in the fundamental mode, and in addition the free carrier absorption and the substrate radiation loss become smaller in the fundamental mode. This means that lasing is likely to occur in the fundamental mode.

However, the present inventors have discovered the fact that the optical waveguide can propagate a higher-order mode as well as the fundamental mode in which lasing occurs and, hence a undesirable wavelength separation occurs in the lasing spectrum of laser light. Such a wavelength separation causes a full width at half maximum to increase and inhibits the oscillation wavelength to continuously vary even when the temperature or the injection current is continuously varied. For this reason, use of such a semiconductor laser as a light source for pumping a solid-state laser, fiber laser, fiber amplifier or the like results in a decrease in pumping efficiency and an unstable output. Thus, problems will be raised in applications.

SUMMARY

It is an object of the invention to provide a semiconductor laser apparatus which is capable of a stabilized high power operation by inhibiting wavelength separation caused by a higher-order mode in an epitaxial direction.

The invention provides a semiconductor laser apparatus comprising an active layers, n-type and p-type optical waveguide layers provided on both sides of the active layer, the n-type and p-type optical waveguide layers each having a bandgap larger than that of the active layer, and n-type and p-type cladding layers disposed so that the active layer and the optical waveguide layers are sandwiched therebetween, the n-type and p-type cladding layers each having a bandgap larger than that of each of the waveguide layers, wherein a condition represented by the following formula (A) is satisfied:

$$nc1 \leq Re(ne1) \quad (A)$$

wherein nc1 represents a smaller one of refractive indices of the n-type and p-type cladding layers, Re(ne1) represents a real part of an effective refractive index of a first-order guided mode of an optical waveguide including the optical waveguide layers and the cladding layers, and wherein compositions of the n-type and p-type cladding layers are made asymmetrical, whereby no higher-order waveguide mode exists in an epitaxial direction.

According to the invention, by setting the real part Re(ne1) of the effective refractive index of the first-order guided mode to be equal to or larger than that of the smaller one of the refractive indices of the n-type and p-type cladding layers the intensity of light existing in the active layer can be lowered, thereby raising an optical power at which the catastrophic optical mirror damage occurs on the light-emitting facet. Thus, a higher power operation can be realized.

Furthermore, according to the invention, by making the compositions of the n-type and p-type cladding layers asymmetrical, a higher-order waveguide mode in the thickness direction is avoided. Accordingly only a fundamental mode can be propagated with low loss and wavelength separation in oscillation spectrum can be prevented.

In the invention it is preferable that an optical waveguide including the optical waveguide layers and the cladding layers satisfies a condition represented by the following formula (1):

$$\frac{t}{\lambda}\sqrt{nw^2 - nc1^2} \geq \frac{1}{2} \quad (1)$$

wherein $\lambda$ represents a laser wavelength in a vacuum, t represents a thickness between the n-type and p-type cladding layers, nw represents a refractive index of the n-type and p-type optical waveguide layers, nc1 represents the smaller one of the refractive indices of the n-type and p-type cladding layers, and nc2 represents a larger one of the refractive indices of the n-type and p-type cladding layer.

According to the invention, the condition represented by the formula (1) is satisfied, so that the intensity of light existing in the active layer can be lowered, thereby raising an optical output at which the COMD occurs on the light-emitting facet. Thus, a higher power operation can be realized.

In the invention it is preferable that a condition represented by the following formula (2) is satisfied:

$$Re(ne1) < nc2 \leq ne0 \quad (2)$$

wherein ne0 represents an effective index of a fundamental guided mode in the optical waveguide, and Re(ne1) represents the real part of the effective index of a first-order guided mode.

According to the invention, the condition represented by the formula (2) is satisfied, so that the fundamental guided mode can be propagated in middle layers and the first-order guided mode leaks into the cladding layer having the refractive index nc2. As a result only the fundamental guided mode can be propagated with low loss and wavelength separation in oscillation spectrum can be prevented.

The principle of the invention is as follows. FIG. 4 is a sectional view illustrating a typical structure of a semiconductor laser apparatus. On a substrate 111 of n-type GaAs are sequentially formed using metalorganic vapor phase epitaxy (MOVPE) or a like process an n-type cladding layer 112 (AlGaAs, Al context x=0.20, thickness t=1.2 $\mu$m), an n-type optical waveguide layer 113 (GaAs, t=0.49 $\mu$m), an n-type carrier blocking layer 114 (AlGaAs, x=0.40, t=0.03 $\mu$m), an active layer 115 (composed of an $In_{0.28}Ga_{0.82}As$ quantum well layer and GaAs barrier layers), a p-type carrier blocking layer 116 (AlGaAs, x=0.40, t=0.03 $\mu$m), a p-type optical waveguide layer 117 (GaAs, t=0.49 $\mu$m), and a p-type cladding layer 118 (AlGaAs, x=0.20, t=1.2 $\mu$m). On the p-type cladding layer 118 is further formed a p-type cap layer 120 (GaAs), in which a pair of n-type current blocking layers 119 (GaAs) are buried to form a current injection region 101 (width=100 $\mu$m).

A resonator extending in a direction perpendicular to the plane of the drawing is 2.2 mm long and has a light-emitting facet formed with an optical coating having a reflectance of 2% and an opposite facet with an optical coating having a reflectance of 96% after cleavage. Electrodes (not shown) are formed on the underside of the substrate 111 and the top of the p-type cap layer 120, respectively.

FIG. 5 is a graph showing a variation with temperature in oscillation spectrum of the semiconductor laser apparatus 100 of FIG. 4, in which graph the vertical axis represents peak wavelength (nm) and the horizontal axis represents case temperature (° C.), and the operation current $I_{op}$ was 2 (A). As seen from the graph, the peak wavelength varied linearly with temperature at a rate of change of about 0.25 nm/° C., and the peak wavelength varied stepwise at about 25° C. and about 50° C., which proves that a wavelength separation occurred.

FIG. 6 is a graph showing an oscillation spectrum of the semiconductor laser apparatus 100 of FIG. 4, in which graph the vertical axis represents spectral band intensity (dBm), and the horizontal axis represents wavelength (nm). This graph shows a wavelength separation that occurred when the case temperature was 50° C., in which two peaks appeared having respective wavelengths of 984.7 nm and 987.9 nm with a separation spacing of about 3.2 nm.

In analyzing an optical waveguide of a multilayered slab structure such as a semiconductor laser apparatus, the solution to a Maxwell's equation can be found by a stepwise partitioning method (refer to Kenji Kono, "Fundamental and Applications of Optical Coupling Systems for Optical Devices", 1991). From the analysis, the semiconductor laser apparatus 100 shown in FIG. 4 is found to allow propagation of the fundamental (zero-order) mode and the first-order mode.

FIG. 7 is a graph showing the refractive index distribution and effective refractive index and mode profile of each mode of an optical waveguide in a semiconductor laser apparatus 100 of FIG. 4. In the graph, the vertical axis represents refractive index, and the horizontal axis represents the location ($\mu$m) from the interface between the n-type cladding layer 112 and the n-type optical waveguide layer 113, the interface being the point or origin, an upper location from the interface assuming a positive value.

In the refractive index distribution, the refractive indices of the n-type and p-type cladding layers 112 and 118 are low, while that of the central portion sandwiched between these cladding layers is high, thus forming an optical waveguide. From the results of the analysis, the profile of the fundamental mode is found to be a single-peak curve having slight dents adjacent the carrier blocking layers 114 and 116, while the profile of the first-order mode found to be a twin-peak curve. The effective indices ne0 and ne1 of the fundamental mode and the first-order mode are defined by eigenvalues of a Maxwell's equation and can be found by numerical calculations. In the case of the semiconductor laser apparatus 100 shown in FIG. 4, ne0=3.509, and ne1=3.478.

The mechanism of an occurrence of wavelength separation is as follows. Where the modes which can be propagated along an optical waveguide are the fundamental mode and the first-order mode, faint mode conversions from the fundamental mode to the first-order mode and vice versa occur at the opposite facets of a semiconductor laser. Since there is a difference in effective refractive index between modes of different mode numbers, the optical resonator length of the fundamental mode differs from that of the first-order mode. It can be conceived that a sort of double resonator effect occurs through such mode conversions.

The resonance condition of a laser resonator is considered here. The resonance condition of a fundamental mode is given by the following formula (11):

$$m0 \cdot \lambda m0 = 2 \cdot L \cdot ne0 \tag{11}$$

wherein $\lambda m0$ represents the wavelength of light; L represents a resonator length, ne0 represents the effective refractive index of the fundamental mode, and m0 represents a number of loops of a standing wave.

As the number of loops of a standing wave increases or decreases one by one, the lasing wavelength varies discontinuously, and taking the wavelength dependence of the effective refractive index into consideration, a wavelength spacing $\Delta\lambda 0$ is given by the following formula (12):

$$\Delta\lambda 0 = \frac{\lambda^2}{2 \cdot L \left( ne0 - \lambda \cdot \frac{\partial ne0}{\partial \lambda} \right)} \tag{12}$$

On the other hand, the resonance condition of the first-order mode is given by the following formula (13):

$$m1 \cdot \lambda m1 = 2 \cdot L \cdot ne1 \tag{13}$$

wherein $\lambda m1$ represents the wavelength of light, L represents the resonator length, ne1 represents the effective refractive index of the first-order mode, and m1 represents the number of loops of a standing wave.

Taking the wavelength dependence of the effective refractive index into consideration, the wavelength spacing $\Delta\lambda 1$ in the first-order mode is given by the following formula (14):

$$\Delta\lambda 1 = \frac{\lambda^2}{2 \cdot L \left( ne1 - \lambda \cdot \frac{\partial ne1}{\partial \lambda} \right)} \tag{14}$$

Where mode conversions from the fundamental mode to the first-order mode and vice versa occur at the opposite end faces of the semiconductor laser, a loss is considered to be minimized at a wavelength which satisfies both the resonance condition (11) of the fundamental mode and the resonance condition (13) of the first-order mode. The wavelength spacing $\Delta\lambda 01$ in this case, which corresponds to a wavelength separation spacing, is given by the following formula (15):

$$\Delta\lambda 01 = \frac{\lambda^2}{2 \cdot L\left\{\left(ne0 - \lambda \cdot \frac{\partial ne0}{\partial\lambda} - ne1 - \lambda \cdot \frac{\partial ne1}{\partial\lambda}\right)\right\}} \quad (15)$$

Here, such considerations are applied to the semiconductor laser apparatus 100 as shown in FIG. 4. Since the effective refractive indices of the fundamental mode and first-order mode are ne0=3.509, and ne1=3.478, respectively, and the relation between the refractive index of an AlGaAs semiconductor and the Al content x is known, the effective Al contents for the fundamental mode and the first-order mode are found to be 0.048 and 0.10, respectively. Further, the wavelength dependences (differential terms) of the refractive indices at these effective Al contents are found to be −0.49 (/μm) in the fundamental mode and −0.45 (/μm) in the first-order mode.

When these values and L=2.2 mm and λ=984.7 nm are substituted into the formula (15), the wavelength separation spacing is found to be $\Delta\lambda 01$=3.1 nm, which substantially agrees to the experimental value, or about 3.2 nm, obtained in FIG. 6. Thus, a wavelength separation as shown in FIG. 6 is found to derive from the double resonator effect.

While the foregoing description has been made of an illustrative construction including carrier blocking layers like the semiconductor laser apparatus 100 shown in FIG. 4, it is possible that a wavelength separation in oscillation spectrum as described above occurs in semiconductor lasers having optical waveguides which can propagate a higher-order mode, in general.

To solve such a problem, there is provided a semiconductor laser in which the intensity of light existing in the active layer thereof is lowered and, hence, an optical output at which the COMD on the light-emitting facet of the laser occurs is raised by virtue of the provision of an optical waveguide including optical waveguide layers and cladding layers which satisfies a condition represented by the formula (1):

$$\frac{t}{\lambda}\sqrt{nw^2 - nc1^2} \geq \frac{1}{2} \quad (1)$$

where λ represents the wavelength of laser light in a vacuum, t represents the thickness between two optical cladding layers, nw represents a refractive index of the optical waveguide layers, nc1 represents the smaller one of the refractive indices of the two optical cladding layers, and nc2 represents the larger one of the refractive indices of the cladding layers, and which optical waveguide further satisfies the condition represented by the formula (2):

$$Re(ne1) < nc2 \leq ne0 \quad (2)$$

wherein ne0 represents the effective refractive index of a fundamental guided mode, and Re(ne1) represents the real part of the effective refractor index of the first-order guided mode. In this semiconductor laser, the fundamental guided mode can propagate in the middle layers, while the first-order guided mode leaks into the cladding layer having the refractive index nc2. As a result, only the fundamental guided mode can propagate with low loss thereby inhibiting the occurrence of wavelength separation in oscillation spectrum.

In the semiconductor laser apparatus 100 shown in FIG. 4, for example, the effective refractive index ne1 of the first-order guided mode is 3.478, the refractive index nc2 of the cladding layer having the larger refractive index is 3.42, and the effective index ne0 of the fundamental mode is 3.509, and these values do not satisfy the formula (2). Thus, the semiconductor laser apparatus 100 permits propagation of the first-order mode undesirably.

Thus, only when both the conditions of the formulae (1) and (2) are satisfied, it is possible to realize stabilized lasing of only the fundamental guided mode with propagation of the first-order mode inhibited, while lowering the intensity of light existing in the active layer to ensure a higher power operation. Further, since the light intensity of the fundamental mode is distributed widely and outwardly beyond the active layer 515 as shown in FIG. 2, the intensity of light existing in the active layer 515 further lowers, so that an optical output at which the COMD on the light-emitting facet can be raised, thereby enabling a further higher power operation.

In the invention it is preferable that a carrier blocking layer is provided between the active layer and each of the optical waveguide layers, the carrier blocking layer having a bandgap larger than those of the active layer and the optical waveguide layer.

The provision of the carrier blocking layer having a larger bandgap between the active layer and each of the optical waveguide layers allows confinement of carriers in the active layer and confinement of light in the optical waveguide layers to function independently of each other. This improves the temperature characteristics of the semiconductor laser thereby enabling a higher power operation.

The invention becomes more advantageous when applied to a semiconductor laser having a refractive index distribution structure in the layers for controlling the transverse mode of laser light.

In some applications, it is desirable that each of the oscillation mode configurations of both the vertical mode and the transverse mode in the semiconductor laser of the invention should be a single Gaussian profile. This is because a semiconductor laser generating a single mode can emit light of a higher density thereby enabling easy coupling to an optical fiber.

To this end, an effective difference in refractive index is also provided in the transverse direction by utilizing an SAS (self-aligned structure) in which layers having different refractive indices are formed on opposite sides of a stripe, a ridge structure in which both sides of a stripe are etched, or interlayer diffusion of constitutional atoms achieved by ion implantation, thereby to form an optical confinement structure.

In the design of a refractive index distribution, it is assumed that confinement of the vertical mode and that of the transverse mode, generally, are in an independent relationship to each other. Actually, however, the two influence each other. For this reason, where the vertical mode confinement is designed to admit a higher-order mode, there may occur an undesirable wavelength separation or a transverse mode disturbance.

Thus, by inhibiting the occurrence of a higher-order vertical mode according to the invention, it is possible to stabilize the transverse mode as well and material good vertical and transverse Gaussian profiles, thereby obtaining satisfactory current vs. output characteristic without a kink until a higher optical output is reached.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
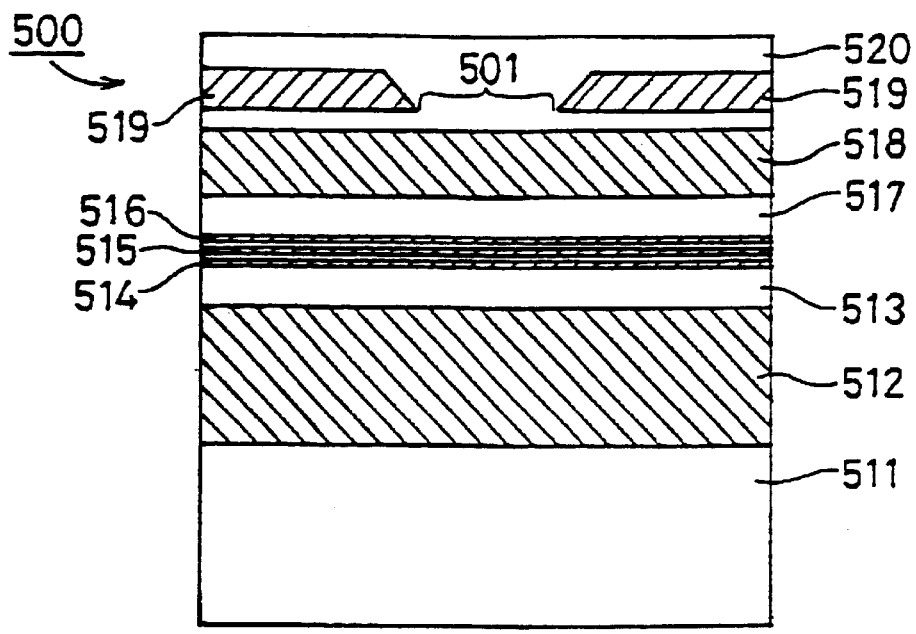
FIG. 1 is a sectional view illustrating one embodiment of the invention.

Now referring to the drawings, preferred embodiments of the invention are described below.

FIG. 1 is a sectional view of a semiconductor laser apparatus illustrating one embodiment of the invention. On a substrate 511 of n-type GaAs are sequentially formed using metalorganic vapor phase epitaxy (MOVPE) or a like process an n-type cladding layer 512 (AlGaAs, Al content x=0.07, thickness t=2.86 μm), an n-type optical waveguide layer 513 (GaAs, t=0.49 μm), an n-type carrier blocking layer 514 (AlGaAs, x=0.40, t=0.03 μm), an active layer 515 (composed of an $In_{0.18}Ga_{0.82}As$ quantum well layer and GaAs barrier layers), a p-type carrier blocking layer 516 (AlGaAs, x=0.40, t=0.03 μm), a p-type optical waveguide layer 517 (GaAs, t=0.49 μm), and a p-type cladding layer 518 (AlGaAs, x=0.20, t=1.08 μm). On the p-type cladding layer 518 is further formed a p-type cap layer 520 (GaAs), in which a pair of n-type current blocking layers 519 (GaAs) are buried to form a current injection region 501 (width=100 μm).

A resonator extending in a direction perpendicular to the plane of the drawing is 2.2 mm long and has a light-emitting end face formed with an optical coating having a reflectance of 2% and an opposite facet with an optical coating having a reflectance of 96% after cleavage. Electrodes (not shown) are formed on the underside of the substrate 511 and the top of the p-type cap layer 520, respectively.

Figure 2:
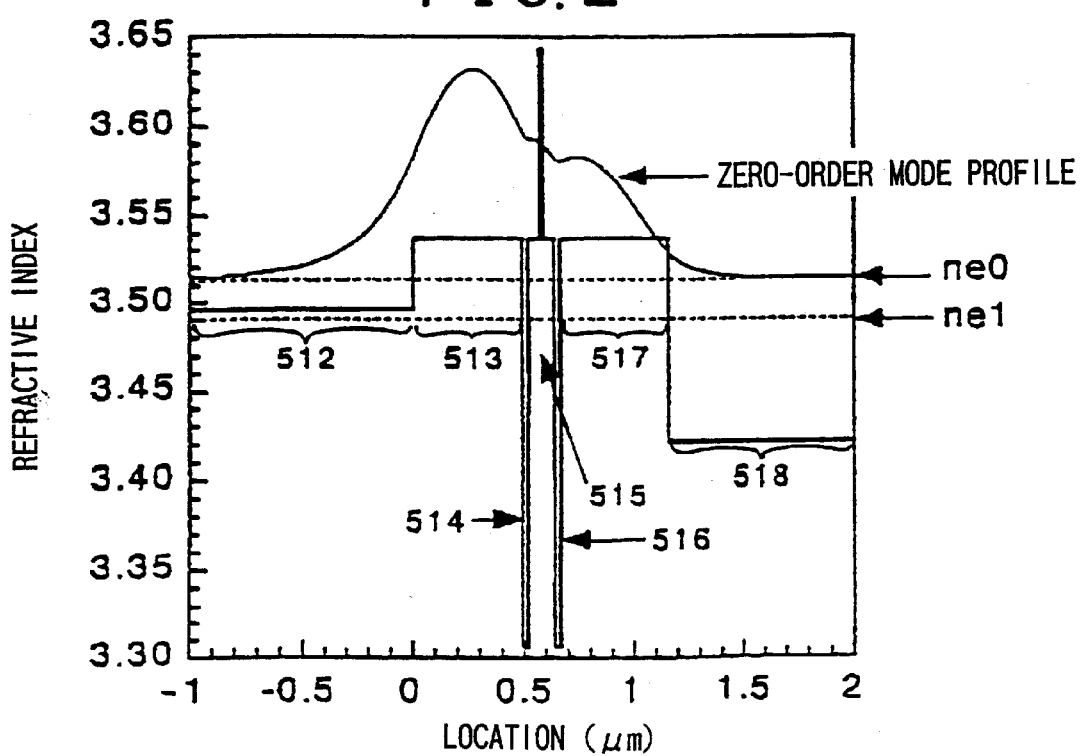
FIG. 2 is a graph showing the refractive index distribution and effective index and mode profile of each mode of an optical waveguide in a semiconductor laser apparatus 500 of FIG. 1.

FIG. 2 is a graph showing the refractive index distribution and effective index and mode profile of each mode of an optical waveguide in a semiconductor laser apparatus 500 of FIG. 1. In the graph, the vertical axis represents the refractive index, and the horizontal axis the location (μm) from the interface between the n-type cladding layer 512 and the n-type optical waveguide layer 513, the interface being the point of origin, an upper location from the interface assuming a positive value.

Figure 7:
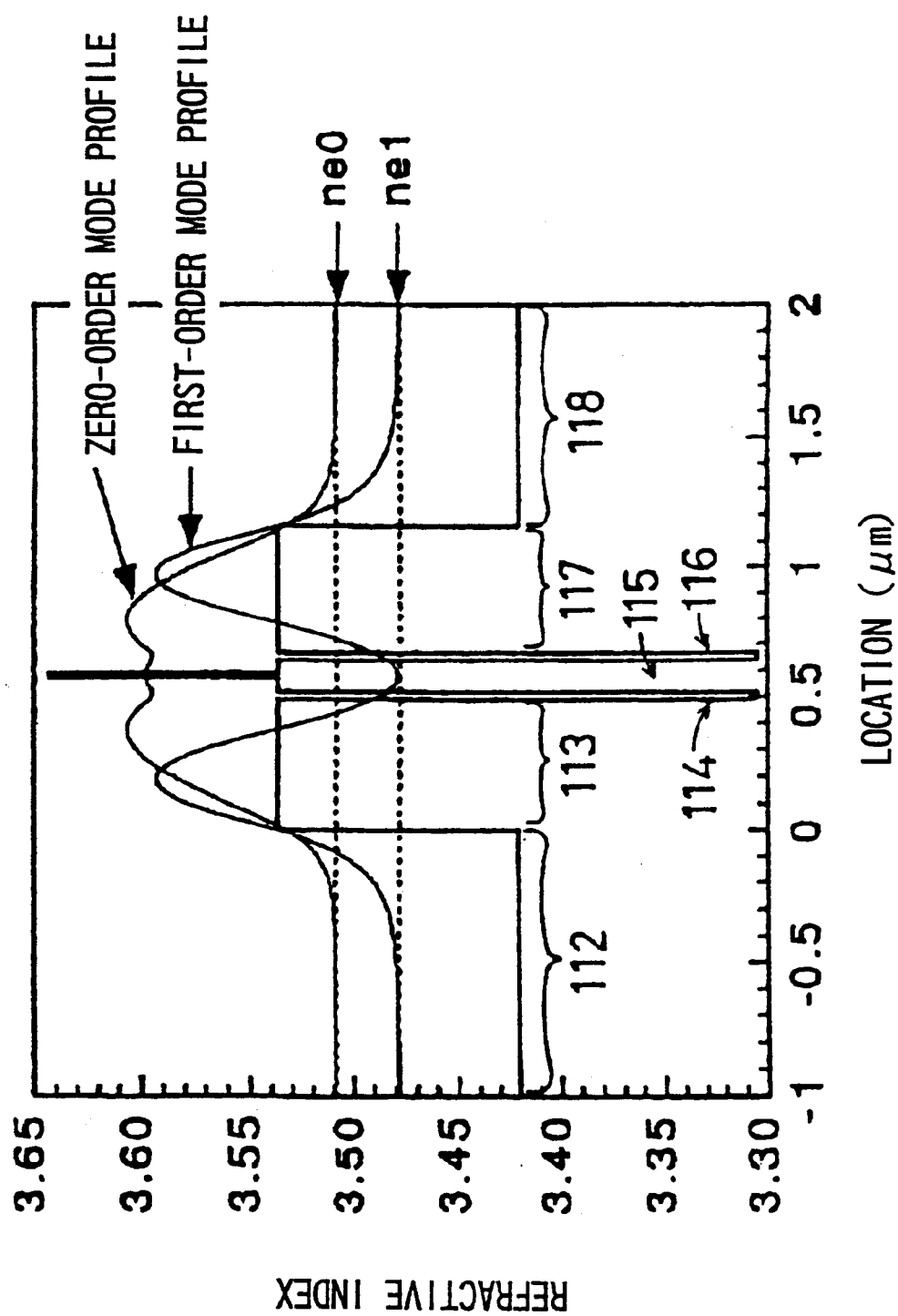
FIG. 7 is a graph showing the refractive index distribution and effective index and mode profile of each mode of an optical waveguide in a semiconductor laser apparatus 100 of FIG. 4.

In the refractive index distribution, the refractive indices of the n-type and p-type cladding layers 512 and 518 are about 3.50 and about 3.42, respectively, and the refractive index of the n-type cladding layer 512 is particularly higher than the corresponding one shown in FIG. 7, thus forming an asymmetrical slab type optical waveguide.

From the results of analysis, the profile of the fundamental mode is found to be a single-peak curve having slight dents adjacent the carrier blocking layers 514 and 516 and shifted, as a whole, toward the n-type cladding layer 512.

The effective refractive indices ne0 and ne1 of the fundamental mode and the first-order mode are defined by eigenvalues of a Maxwell's equation an can be found by numerical calculations. In the case of the semiconductor laser apparatus 500 shown in FIG. 1, ne0=3.513, and Re(ne1)=3.490. Further, the smaller refractive index nc1 of the refractive indices of the n-type and p-type cladding layers 512 and 518 is about 3.42, and the larger refractive index nc2 about 3.50. Since these values satisfy the formula (2), propagation of higher-order modes including the first-order mode can be inhibited.

When the following values: the laser wavelength λ=982 n, the thickness t between the n-type and p-type cladding layers 512 and 518=about 1.158 μm, and the refractive index nw of the n-type and p-type optical waveguide layers 513 and 517=3.538, are substituted into the formula (1), the cut-off condition of the formula (1) is found to be satisfied.

Figure 3:
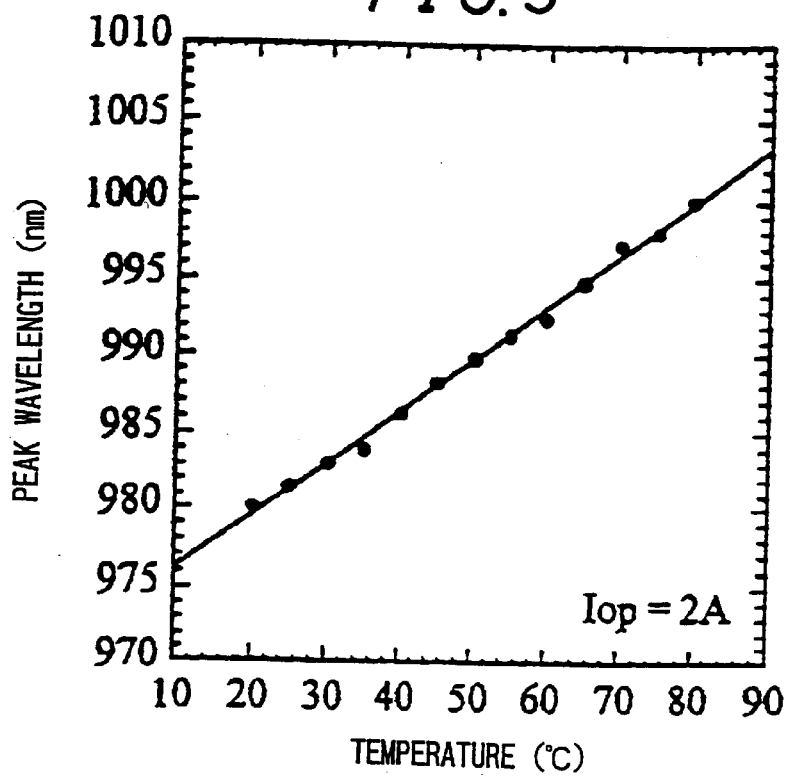
FIG. 3 is a graph showing a variation with temperature in oscillation spectrum of the semiconductor laser apparatus 500 of FIG. 1.
Figure 4:
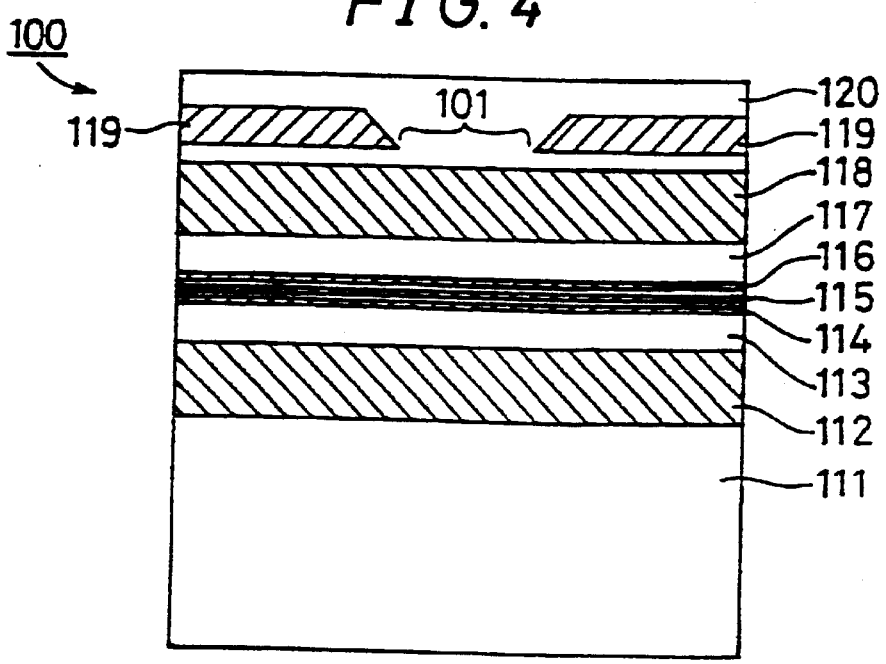
FIG. 4 is a sectional view illustrating a typical structure of a semiconductor laser apparatus.
Figure 5:
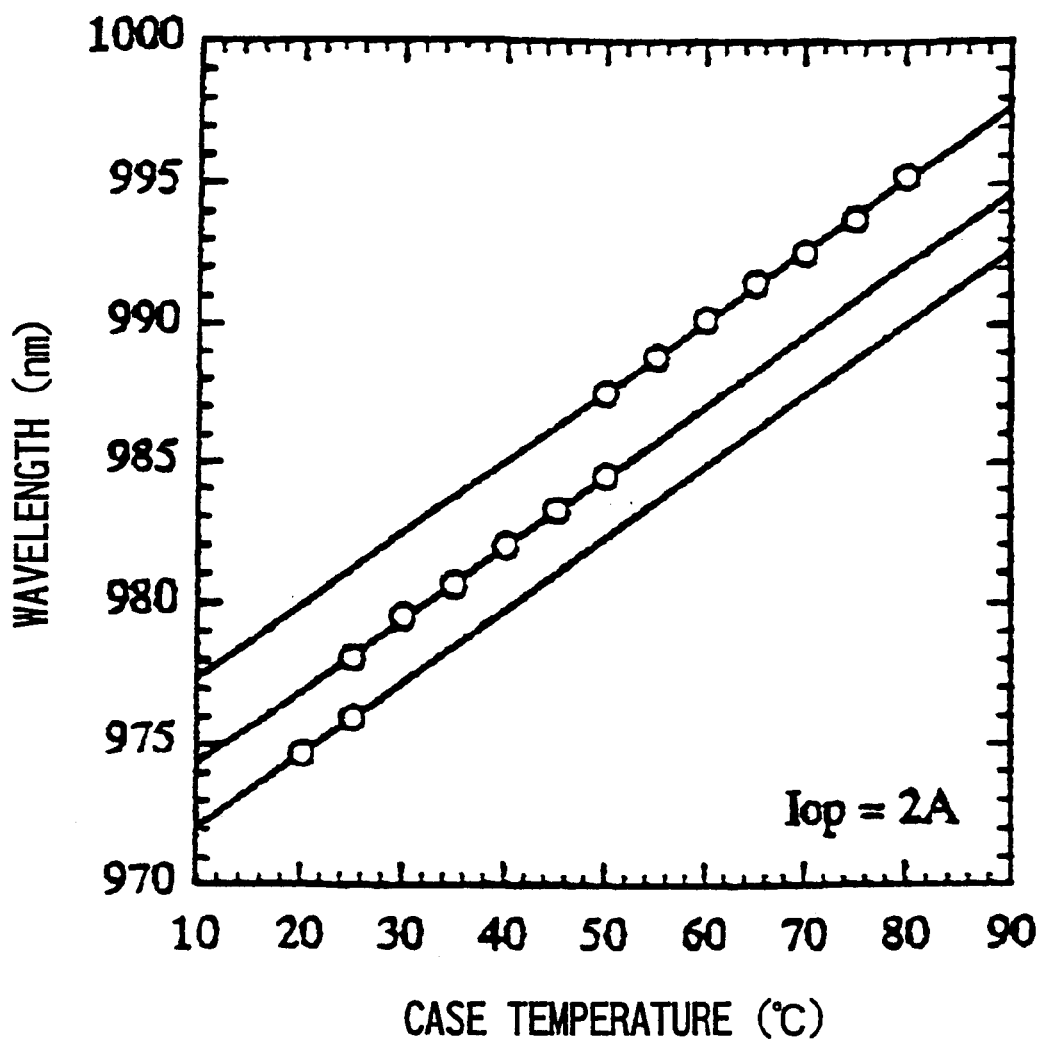
FIG. 5 is a graph showing a variation with temperature in oscillation spectrum of the semiconductor laser apparatus 100 of FIG. 4.
Figure 6:
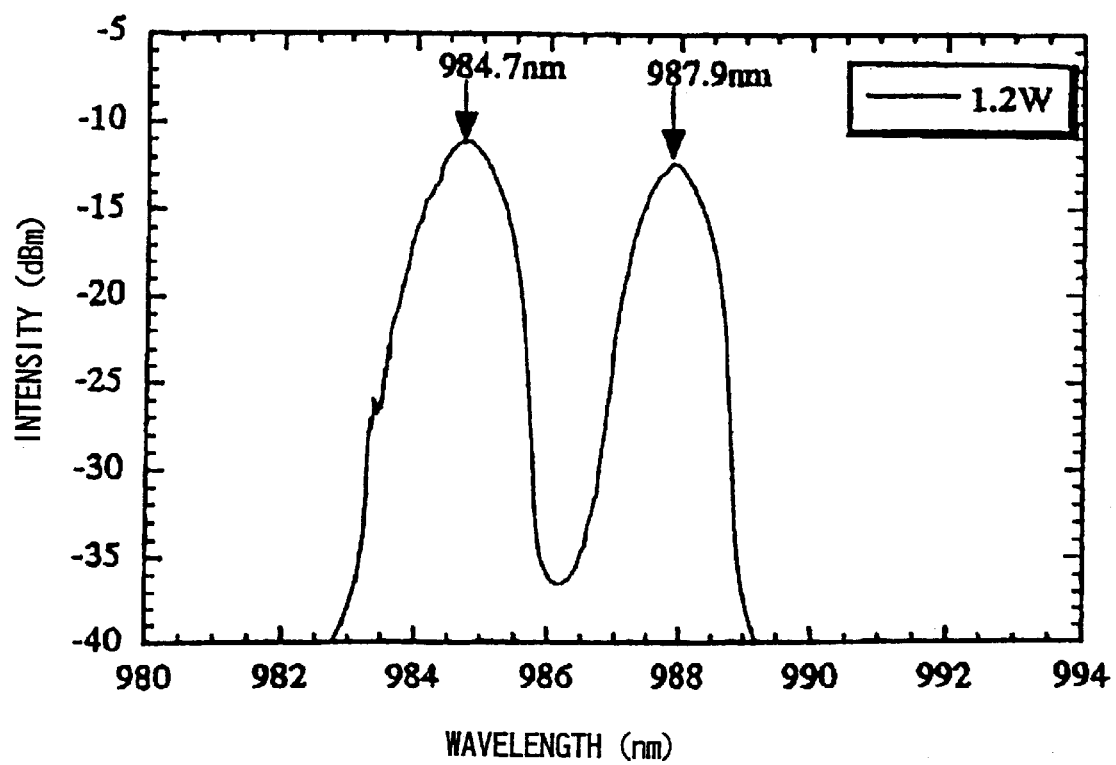
FIG. 6 is a graph showing an oscillation spectrum of the semiconductor laser apparatus 100 of FIG. 4.

FIG. 3 is a graph showing a variation with temperature in oscillation spectrum of the semiconductor laser apparatus 500 of FIG. 1, in which the vertical axis represents the peak wavelength (nm) and the horizontal axis the temperature (° C.). As seen from the graph, the peak wavelength varied linearly with temperature without any wavelength separation as seen in FIG. 5.

The rate of change of peak wavelength with temperature was about 0.34 nm/° C., which value substantially agrees to 0.38 nm/° C., which is the rate of change of the bandage of InGaAs forming the quantum well layer of the active layer 515 with temperature (Sadao Adachi, "Physical Properties of III-V Semiconductor Compounds", pp.100–105, 1992, John Wiley & Sons, Inc.). Thus, the semiconductor laser apparatus of the invention was confirmed to perform a laser operation following the theory.

Figure 8:
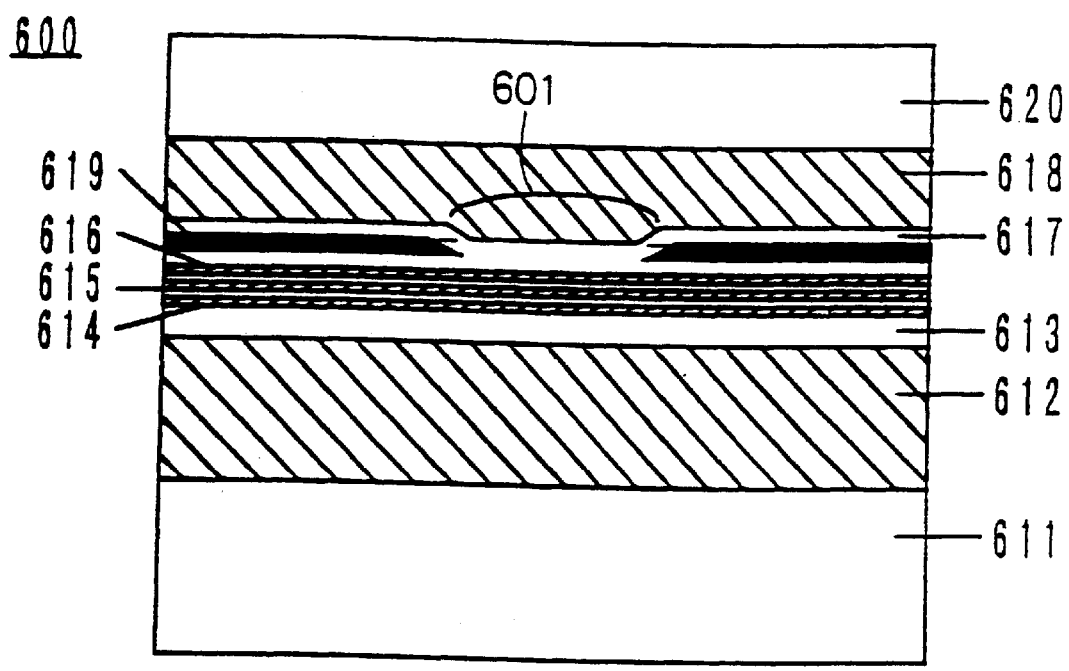
FIG. 8 is a sectional view of a semiconductor apparatus illustrating another embodiment of the invention.

FIG. 8 is a sectional view of a semiconductor laser apparatus illustrating another embodiment of the invention, wherein a refractive index distribution structure is formed in layers for controlling the transverse mode of laser light.

On a substrate 611 of n-type GaAs are sequentially formed using metalorganic vapor phase epitaxy (MOVPE) or a like process an n-type cladding layer 612 (AlGaAs, Al content x=0.09), an n-type optical waveguide layer 613 (GaAs, t=0.48 μm), an n-type carrier blocking layer 614 (AlGaAs, x=0.40, t=0.03 μm), an active layer 615 (composed of an $In_{0.18}Ga_{0.82}As$ quantum well layer and GaAs barrier layers), a p-type carrier blocking layer 616 (AlGaAs, x=0.40, t=0.03 μm), a p-type optical waveguide layer 617 (GaAs, t=0.48 μm), and a p-type cladding layer 618 (AlGaAs, x=0.32, t=1.08 μm). On the p-type cladding layer 618 is further formed a p-type cap layer 620 (GaAs). Further, a pair of n-type current blocking layers 619 (AlGaAs, x=0.20) having a low refractive index are buried in the p-type optical waveguide layer to form a current injection region 601.

A resonator extending in a direction perpendicular to the plane of the drawing is 1.8 mm long and has a light-emitting end face formed with an optical coating having a reflectance of 2% and an opposite end face with an optical coating having a reflectance of 96% after cleavage. Electrodes (not shown) are formed on the underside of the substrate 611 and the top of the p-type cap layer 620, respectively.

Figure 9:
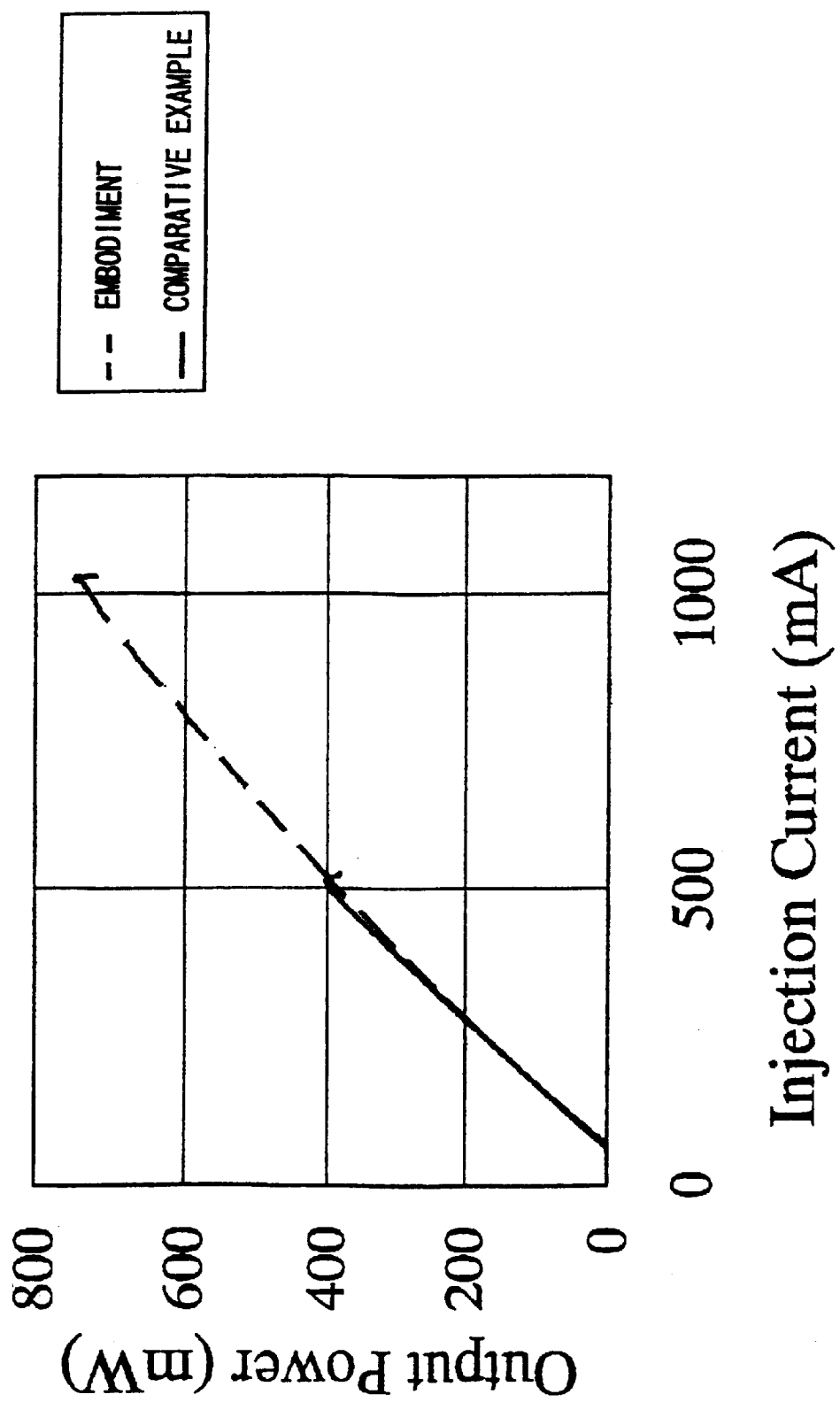
FIG. 9 is a graph showing oscillation characteristics of the semiconductor laser apparatus 600 of FIG. 8 and a comparative example.

FIG. 9 is a graph showing oscillation characteristics of the semiconductor laser apparatus 600 of FIG. 8 and a comparative example, in which the vertical axis represents the optical output (mW) and the horizontal axis the injection current (mA). The measurement was conducted under a CW (continuous wave) operation at room temperature (25° C.). In the embodiment, as seen from the graph, a kink indicative of a mode disturbance appeared at about 750 mW, which means that oscillation in a stabilized mode was maintained until a higher output was reached.

On the other hand, in the comparative example, on a substrate 611 of n-type GaAs are sequentially formed using metalorganic vapor phase epitaxy (MOVPE) or a like process an n-type cladding layer 612 (AlGaAs, Al content x=0.17), an n-type optical wavelength layer 613 (GaAs, t=0.48 $\mu$m), an n-type carrier blocking layer 614 (AlGaAs, x=0.40, t=0.03 $\mu$m, an active layer 615 (composed of an $In_{0.18}Ga_{0.82}As$ quantum well layer and GaAs barrier layers), a p-type carrier blocking layer 616 (AlGaAs, x=0.40, t=0.03 $\mu$m), a p-type optical waveguide layer 617 (GaAs, t=0.48 $\mu$m), and a p-type cladding layer 618 (AlGaAs, x=0.17). On the p-type cladding layer 618 is further formed a p-type cap layer 620 (GaAs). Further, a pair of n-type current blocking layers 619 (AlGaAs, x=0.20) having a low refractive index are buried in the p-type optical waveguide layer to form a current injection region 601.

In the comparative example, as seen from the graph, a kink appeared at about 400 mW, which means the comparative example is inferior to the embodiment.

While the description has been made of the optical waveguide structures respectively having the carrier blocking layers 514, 516 and 614,616, it is apparent that the invention is applicable to other waveguide structures free of any carrier blocking layer.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser apparatus comprising:
   an active layer;
   n-type and p-type optical waveguide layers provided on both sides of the active layer, the n-type and p-type optical waveguide layers each having a bandgap larger than that of the active layer; and
   n-type and p-type cladding layers disposed so that the active layer and the optical waveguide layers are sandwiched therebetween, the n-type and p-type cladding layers each having a bandgap larger than those of the waveguide layers,
   wherein a condition represented by the following formula (A) is satisfied:

$$nc1 \leq Re(ne1) \tag{A}$$

wherein nc1 represents a smaller one of refractive indices of the n-type and p-type cladding layers, Re(ne1) represents a real part of an effective refractive index of a first-order guided mode of an optical waveguide including the optical waveguide layers and the cladding layers, and
   wherein the compositions of the n-type and p-type cladding layers are made asymmetrical, whereby no higher-order waveguide mode exists in an epitaxial direction.

2. The semiconductor laser apparatus of claim 1, wherein the optical waveguide satisfies a condition represented by the following formula (1):

$$\frac{t}{\lambda}\sqrt{nw^2 - ncl^2} \geq \frac{1}{2} \tag{1}$$

where $\lambda$ represents a laser wavelength in a vacuum, t represents a thickness between the n-type and p-type cladding layers, nw represents a refractive index of the n-type and p-type optical waveguide layers, and nc1 represents the smaller one of the refractive indices of the n-type and p-type cladding layers.

3. The semiconductor laser apparatus of claim 2, wherein a condition represented by the following formula (2) is satisfied:

$$Re(ne1) < nc2 \leq ne0 \tag{2}$$

wherein ne0 represents an effective refractive index of a fundamental guided mode in the optical waveguide, Re(ne1) represents the real part of the effective refractive index of the first-order guided mode and nc2 represents a larger one of the refractive indices of the n-type and p-type cladding layer.

4. The semiconductor laser apparatus of claim 1, wherein a carrier blocking layer is provided between the active layer and each of the optical waveguide layers, the carrier blocking layer having a bandgap larger than those of the active layer and optical waveguide layers.

5. The semiconductor laser apparatus of claim 2, wherein a carrier blocking layer is provided between the active layer and each of the optical waveguide layers, the carrier blocking layer having a bandgap larger than those of the active layer and optical waveguide layers.

6. The semiconductor laser apparatus of claim 3, wherein a carrier blocking layer is provided between the active layer and each of the optical waveguide layers, the carrier blocking layer having a bandgap larger than those of the active layer and optical waveguide layers.

7. The semiconductor laser apparatus of claim 1, wherein the semiconductor laser apparatus has a refractive index distribution structure in the layers for controlling a transverse mode of laser light.

8. The semiconductor laser apparatus of claim 2, wherein the semiconductor laser apparatus has a refractive index distribution structure in the layers for controlling a transverse mode of laser light.

9. The semiconductor laser apparatus of claim 3, wherein the semiconductor laser apparatus has a refractive index distribution structure in the layers for controlling a transverse mode of laser light.

10. A method of inhibiting higher-order waveguide modes in a semiconductor laser device comprising:
    providing an active layer;
    providing n-type and p-type optical waveguide layers on both sides of the active layer, the n-type and p-type optical waveguide layers each having a bandgap larger than that of the active layer; and providing n-type and p-type cladding layers disposed so that the active layer and the optical waveguide layers are sandwiched therebetween, the n-type and p-type cladding layers each having a bandgap larger than those of the waveguide layers, wherein refractive indices of the n-type and p-type cladding layers are different, wherein a smaller one of said refractive indices is less than or equal to the real part of an effective refractive index of a first-order guided mode of an optical waveguide including the optical waveguide layers and the cladding layers, and wherein compositions of the n-type and p-type cladding layers are asymmetrical such that a fundamental guided mode can be propagated in the optical waveguide and such that higher-order guided modes including the first-order guided mode cannot be propagated in the optical waveguide.

11. A semiconductor laser apparatus comprising:

an active layer;

an n-type optical waveguide layer provided at one side of the active layer and a p-type optical waveguide layer provided at an opposing side of the active layer, the n-type and p-type optical waveguide layers each having a bandgap larger than that of the active layer; and n-type and p-type cladding layers disposed so that the active layer and the optical waveguide layers are sandwiched therebetween, the n-type and p-type cladding layers each having a bandgap larger than those of the waveguide layers, wherein a condition given by $nc1 \leq Re(ne1)$ is satisfied, wherein $nc1$ represents a smaller one of refractive indices of the n-type and p-type cladding layers and $Re(ne1)$ represents a real part of an effective refractive index of a first-order guide mode of an optical waveguide associated with the optical waveguide layers and the cladding layers, and wherein compositions of the n-type cladding layers are asymmetrical such that a fundamental guided mode can be propagated in the optical waveguide and such that higher-order guided modes including the first-order guided mode cannot be propagated in the optical waveguide.

* * * * *